Aug. 3, 1965 N. C. TURNER 3,199,003

ENCLOSURE FOR SEMICONDUCTOR DEVICES

Filed Oct. 26, 1961

INVENTOR
NORMAN C. TURNER

BY W. S. Hill
AGENT

United States Patent Office 3,199,003

Patented Aug. 3, 1965

3,199,003

ENCLOSURE FOR SEMICONDUCTOR DEVICES

Norman C. Turner, Hopatcong, N.J., assignor to Radio Corporation of America, a corporation of Delaware Filed Oct. 26, 1961, Ser. No. 147,810
3 Claims. (Cl. 317—235)

This invention relates to an improved means for enclosing semiconductor devices. More particularly, the invention relates to an improved semiconductor device enclosure which provides improved heat dissipation while retaining electrical isolation of each device from its enclosure.

In the production of semiconductor devices, for example bipolar transistors and unipolar transistors, it is desirable to protect the device from mechanical damage by enclosing it in a rigid container such as a metal can or case. It is also desirable to keep oxygen and moisture away from the device in order to prevent deterioration of important electrical device parameters, such as the current transfer ratio. Both of these objectives are generally accomplished by hermetically sealing the semiconductor device inside the container or case.

An important additional requirement is that the container or semiconductor device enclosure should readily transfer to a heat sink the waste heat dissipated by the operation of the semiconductor device, since otherwise the device may become overheated and degrade or fail during prolonged operation. Another important requirement usually is that the device be electrically isolated from the enclosure. It has been found relatively difficult to satisfy both of these requirements at the same time. A number of procedures have been utilized to provide heat dissipation for encapsulated semiconductor devices, but when it is desired to retain the advantage of electrical isolation of the device from the enclosure, these procedures tend to be relatively complex and expensive.

Accordingly, it is an object of the invention to provide an improved semiconductor device enclosure.

Another object of the invention is to provide an improved semiconductor device enclosure which is relatively simple and inexpensive to fabricate.

But another object is to provide an improved semiconductor device enclosure in which the device is electrically isolated from the case.

Still another object of the invention is to provide an improved semiconductor device enclosure which effectively dissipates the waste heat generated by the operation of the device.

These and other objects are accomplished by the instant invention, which provides an improved semiconductor device enclosure that efficiently dissipates heat while maintaining electrical isolation of the device from the enclosure. The enclosure comprises a metal ring or annulus around an electrically insulating disk. The insulating disk, which may for example consist of glass or ceramic, has two major faces. A metal platform on one face of the insulating disk is embedded in the disk, and covers part of the one disk face, but is insulated from the metal ring. The semiconductor device is mounted directly on top of the platform. A first metal lead extends from the bottom of the platform out of the other major face of the insulating disk. At least one additional metal lead through the insulating disk extends out of both faces of the disk, and is electrically insulated from both the platform and the ring. A connecting means such as a metal ribbon or wire is attached between each additional lead and the semiconductor devices. The enclosure is completed by means of a metal can over the platform side of the disk, the can being sealed to the periphery of the ring or annulus.

The invention and its features will be more fully described by the following examples, when considered in conjunction with the accompanying drawing, wherein:

FIGURES 1*a*–1*d* are cross-sectional views taken along the line I—I of FIG. 3 of successive steps in the enclosure of a semiconductor device in accordance with one embodiment of the invention;

Similar elements are designated by similar reference characters throughout the drawing.

*Example I*

Figure 1A:
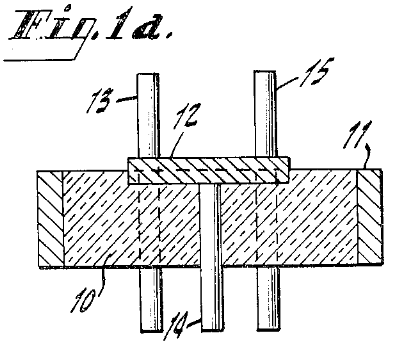

The first step in the enclosure of a semiconductor device according to this embodiment of the invention is the preparation of the header or stem illustrated in FIGURE 1*a*. This header comprises an insulating disk 10 surrounded by a metallic ring or annulus 11. Suitable insulating materials for the disk 10 are glasses, ceramics and refractory oxides such as aluminum oxide and beryllium oxide. In this example, disk 10 consists of glass. The annulus or ring 11 may be made of pure metals, such as nickel, gold, and the like, or of various alloys. Alloys of iron, nickel and cobalt, of the types commercially available as Kovar and Fernico, have been found particularly suitable for this purpose. It will be understood that the term "metallic" as used hereinafter in the specification and claims is intended as generic to both pure metals and alloys.

Embedded in one face of disk 10 is a metallic platform 12. The platform 12 may be partly embedded in disk 10 as shown in FIGURE 1, or completely embedded so that the upper surface of the platform is in the same continuous plane as the upper surface of the disk, as in FIGURE 2. Platform 12 may be composed of one of the pure metals or alloys mentioned above. In this example, the metal ring 11 and the platform 12 both consist of an iron-cobalt-nickel alloy, and both are gold-plated.

There is at least one additional lead through the disk 10 extending out of both major faces of the disk. In this example, there are two such leads 13 and 15, through the disk 10. The leads 13 and 15, the metallic platform 12, and the metallic annulus 11 are all electrically isolated from each other by means of insulating disk 10.

A semiconductor device 16 is now mounted on platform 12. In this example, the device 16 is a silicon mesa transistor comprising an N-type monocrystalline silicon base wafer, a P-type mesa 18 on said wafer, a PN junction 17 between the P-type mesa 18 and the N-type bulk of wafer 16, an N-type diffused region 20 within said mesa, and a PN junction 19 between the P-type mesa 18 and the N-type diffused region 20. A metallic stripe 22 on top of P-type mesa forms an ohmic base connection to the device. In this example metallic stripe 22 consists of aluminum. Another metallic stripe 21 on the N-type diffused region 20 forms an ohmic emitter contact to the device. Stripe 21 may suitably consist of gold.

Figure 1B:
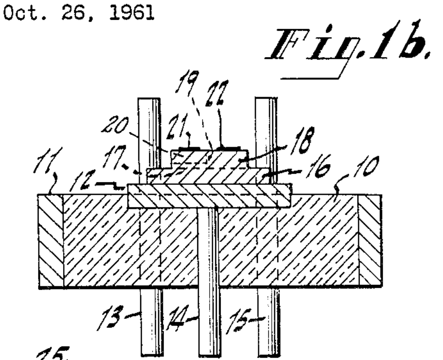

The semiconductor device is mounted on the metallic platform and bonded thereto by any convenient technique, such as soldering. In this example, the silicon transistor 16 is positioned on platform 12 so that mesa 18 is uppermost, and the assemblage of device and header shown in FIGURE 1*b* is heated for about 20 seconds at about 400° C. in a reducing ambient, such as an atmosphere of hydrogen or forming gas. This treatment is sufficient to form a eutectic between the silicon of the device 16 and the gold-plating on platform 12, thus bonding the silicon devices to the platform.

Figure 1C:
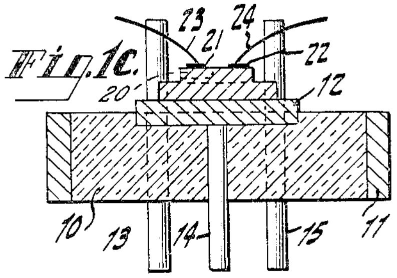
Figure 1D:
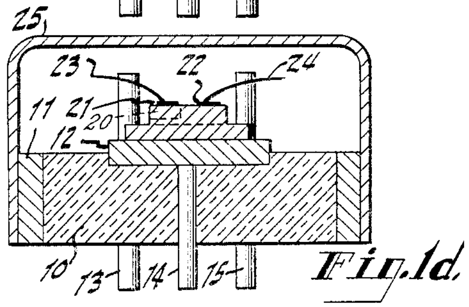

Referring now to FIGURE 1*c*, an electrical connecting means 24 such as a ribbon or wire is attached between lead 15 and base stripe 22, and a similar connecting means 23 is attached between lead 13 and emitter stripe 21. In this example, means 23 and 24 are gold wires that are 99.99% pure and only 1 mil thick. They are attached to their respective metallic stripes by means of a thermo-compression bond. In this example, lead 13 becomes the emitter lead, lead 14 becomes the collector lead, and lead 15 the base lead of the completed device.

The device enclosure is now completed by sealing a metallic can over the platform side of the disk to the metallic ring or annulus 11. The can 25 (FIGURE 1*d*) may be made of nickel, copper, stainless steel, or of iron-cobalt-nickel alloys. The seal can be fabricated by any convenient technique such as spot welding or the like. Preferably the seal is hermetic in character, and is made in a dry inert ambient, so that the atmosphere that remains within the completed enclosure will not injure the device.

Figures 3, 5:
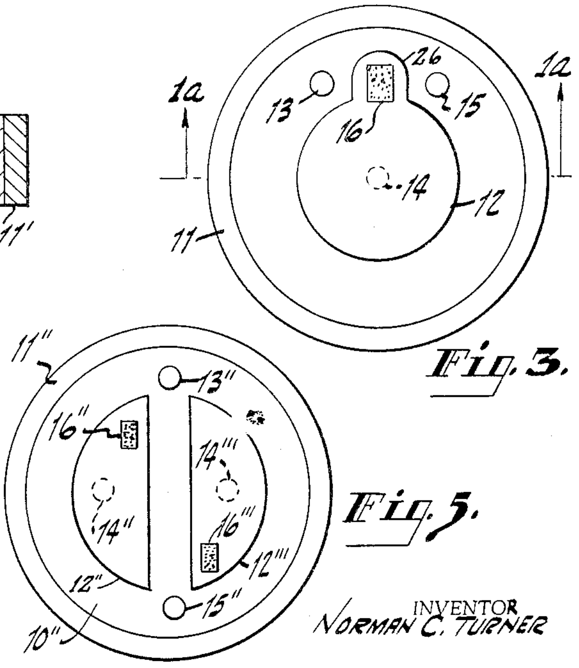
FIGURE 3 is a plan view of the unit shown in FIG. 1*a*.
FIGURE 5 is a plan view of another embodiment of the invention.
Figure 4:
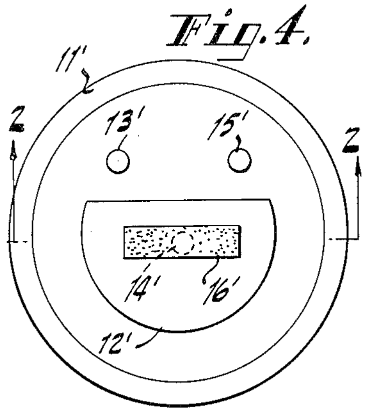
FIGURE 4 is a plan view of the unit shown in FIG. 2.

In the enclosure of Example I the platform 12 has a lobe 26 when viewed in plan between leads 13 and 15, as shown in the plan view of FIGURE 3. The semiconductor device 16 is mounted on the lobe 26, so that the attachment of electrical connecting means between the leads 13 and 15 and the device 16 is facilitated. However, the metallic platform may have other shapes as shown in FIGURES 4 and 5.

The unit thus fabricated has several advantages. Most of the heat generated in a transistor is generated in the collector region, and in this example the heat generated in the device collector is readily transmitted to the metal platform 12, since the collector region and platform are in direct contact, and the bond between them is thermally conductive as well as electrically conductive. The completed device can be mounted on a printed circuit board or on a chassis by inserting the projecting leads in eyelets. From the platform 12 the heat dissipated by the device is conducted directly through the insulating disk 10 to the chassis and ultimately to the atmosphere. Thus the enclosure provides good heat dissipation at low cost. Moreover, since the metallic can 25 is electrically isolated from the semiconductor device, the can is no longer at the device potential, as is the case in some enclosures according to the prior art. In such prior art enclosures, the potential on the annulus of the semiconductor device is frequently high enough to cause shock hazard. The enclosure according to the invention thus brings new freedom to the circuit designer, since he need no longer be concerned with dangerous potentials or inadvertent short circuits on the cans or cases of his semiconductor devices.

*Example II*

Figure 2:
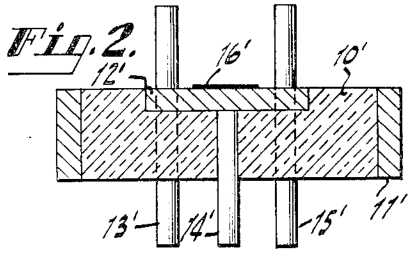
FIGURE 2 is an elevational view partly in section taken along the line II—II of FIG. 4 of the first stage in the enclosure of a semiconductor device according to another embodiment of the invention.

A germanium semiconductor device similar to that described in Example I is cased in an enclosure similar to that described in Example I above, except in the respects hereinafter pointed out. In this example, the insulating disk consists of aluminum oxide. The germanium device is bonded to the metallic platform by means of a tin solder. While in Example I the metallic platform 12 was partly embedded in the insulating disk 14, in this example the plaftorm 12' is embedded in the insulating disk 10', as illustrated in FIGURE 2, so that the upper surface of the platform 12' is continuous with one face of the disk 10'. In this embodiment the transfer of heat from the platform through the disk is somewhat improved over that of Example I, since the contact between the platform and the disk is somewhat better.

The metallic platform utilized may be of various shapes. According to another embodiment of the invention, the platform is shaped as shown in FIGURE 4, which is a plan view of the unit of FIGURE 2 and shows one suitable location for a semiconductor device 16' on the platform 12'. In other respects the arrangement may be similar to that of this Example II.

*Example III*

The principles of the invention may also be applied to the mounting of a plurality of semiconductor devices within a single enclosure. In this example, the insulating disk 10'' consists of beryllium oxide, the metallic annulus 11'' around disk 10' consists of nickel, and two metallic platforms 12'' and 12''' are embedded in one face of the disk, as illustrated in FIGURE 5. Leads 14'' and 14''' are attached to the bottom of platforms 12' and 12''' respectively, and extend through the disk out the other face of the disk. Two additional leads 13'' and 15'' extend through the insulating disk 10'' so as to project out of both faces of the disk. The two platforms 12'' and 12''' are electrically isolated from each other and from the additional leads 13'' and 15'' and from the metallic annulus 11''. One semiconductor device 16'' is mounted on one platform 12'', and another semiconductor device 16''' is mounted on the other platform 12'''. An electrical connection (not shown), which may for example be a gold wire, is attached between device 16'' and lead 13''. A similar connection (not shown) is made between devices 16''' and lead 15''. The enclosure is subsequently completed by sealing a metallic can (not shown) over the platform side of the disk 10'' to the metallic ring 11''. In this example, semiconductor devices 16'' and 16''' are both diodes, hence in the completed device rectification is obtained between leads 13'' and 14'' and also between leads 14''' and 15''.

The above examples are by way of illustration only and not limitation, since various modifications may be made without departing from the spirit and scope of the invention. For example, in the embodiment illustrated in FIGURE 5, the semiconductor devices which are enclosed may be transistors instead of diodes, with two additional leads provided at each platform. Furthermore, different types of semiconductor devices, such as diodes and transistors, may be enclosed in the same case. Moreover, the enclosure is not limited to two devices, since by using a plurality of metallic platforms embedded in the insulating disk as many units as desired may be mounted in a single enclosure. While in the first three examples only one semiconductor device was mounted on each platform, the invention may also be practiced with a plurality of semiconductor devices mounted on each platform. For example, two matched transistors may be mounted on a single platform making a common collector connection to the platform and its associated lead. Four additional leads through the insulating disk then serve to provide two emitter contacts and two base contacts. A plurality of semiconductor devices may thus be cased in a single enclosure so as to operate in parallel.

What is claimed is:

1. A semiconductor device enclosure comprising an insulating disk having two opposing faces, said disk consisting of a material selected from the group consisting of beryllium oxide and aluminum oxide; a metallic ring surrounding said disk; a metallic platform on one face of said disk, said platform embedded in said disk so that the upper surface of said platform is continuous with said one face of said disk but insulated from said ring; a first metallic lead from the bottom of said platform through said disk extending out the other face of said disk; at least one additional lead through said disk insulated from both said platform and said ring and extending out of both said faces; a semiconductor device mounted on said platform; a connecting means between each said additional lead and said device; and a metallic can over the platform side of said disk sealed to the periphery of said ring.

2. A semiconductor device enclosure comprising an insulating disk having two opposing faces; a metallic ring surrounding said disk; a platform of gold-plated nickel-iron-cobalt alloy on one face of said disk, said platform embedded in said disk so that the upper surface of said platform is continuous with said one face of said disk but insulated from said ring; a first metallic lead from the bottom of said platform through said disk extending out the other face of said disk; at least one additional lead through said disk insulated from both said platform and said ring and extending out of both said faces; a semiconductor device mounted on said platform; a connecting wire between each said additional lead and said device; and a metallic can over the platform side of said disk sealed to the periphery of said ring.

3. A semiconductor device enclosure comprising an insulating disk having two opposing faces; a metallic ring surrounding said disk; a plurality of metallic platforms on one face of said disk, said platforms being embedded in said disk so that the upper surface of each said platform is continuous with said one face of said disk but insulated from each other and from said ring; a metallic lead from the bottom of each said platform through said disk extending out the other face of said disk; at least one additional lead through said disk for each said platform, said additional leads being insulated from said platforms and extending out of both said faces; a semiconductor device mounted on each said platform; a connecting means between each said device and at least one of said additional leads; and a metallic can over the platform side of said disk sealed to said ring.

References Cited by the Examiner

UNITED STATES PATENTS

| | | | |
|---|---|---|---|
| 2,615,965 | 10/52 | Amico | 317—235 |
| 2,675,509 | 4/54 | Barton | 317—235 |
| 2,787,744 | 4/57 | Brock et al. | 317—235 |
| 2,796,563 | 6/57 | Ebers et al. | 317—235 |
| 2,848,665 | 8/58 | Little | 317—235 |
| 2,934,588 | 4/60 | Ronci | 317—235 X |
| 2,947,925 | 8/60 | Maynard et al. | 317—235 |

DAVID J. GALVIN, *Primary Examiner.*

JAMES D. KALLAM, GEORGE N. WESTBY, *Examiners.*